US005750210A

United States Patent [19]
Schmidt et al.

[11] Patent Number: 5,750,210
[45] Date of Patent: May 12, 1998

[54] HYDROGENATED CARBON COMPOSITION

[75] Inventors: Paul Herman Schmidt, West Boylston, Mass.; John C. Angus, Cleveland Heights, Ohio

[73] Assignee: Case Western Reserve University, Cleveland, Ohio

[21] Appl. No.: 445,589

[22] Filed: May 22, 1995

Related U.S. Application Data

[60] Continuation of Ser. No. 114,917, Sep. 1, 1993, abandoned, which is a division of Ser. No. 344,990, Apr. 28, 1989, Pat. No. 5,266,409.

[51] Int. Cl.$^6$ .................... H05H 1/24; C23C 14/06; C23C 14/14; C23C 14/32
[52] U.S. Cl. .................... 427/577; 427/530; 427/563; 427/527; 427/578; 204/192.16; 204/192.23
[58] Field of Search ............. 427/530, 523, 427/528, 562, 563, 569, 574, 577, 578, 127, 131, 249, 527; 204/192.15, 192.16, 192.23

[56] References Cited

U.S. PATENT DOCUMENTS

| | | | |
|---|---|---|---|
| 3,057,808 | 10/1962 | Fierce et al. | 260/1 |
| 3,961,103 | 6/1976 | Aisenberg. | |
| 4,343,641 | 8/1982 | Scholes | 428/149 |
| 4,414,319 | 11/1983 | Shirai et al. | 430/65 |
| 4,419,404 | 12/1983 | Arai et al. | 428/336 |
| 4,429,024 | 1/1984 | Ueno et al. | 428/694 |
| 4,461,820 | 7/1984 | Shirai et al. | 430/65 |

(List continued on next page.)

FOREIGN PATENT DOCUMENTS

| | | |
|---|---|---|
| 0 229 936 | 11/1986 | European Pat. Off. . |
| 0 231 894 | 8/1987 | European Pat. Off. . |
| 0 244 874 | 11/1987 | European Pat. Off. . |
| 61-163273 | 7/1986 | Japan . |
| 2-225673 | of 1990 | Japan . |
| 2 149 673 | 6/1990 | Japan . |
| 1597594 | 1/1977 | United Kingdom . |

OTHER PUBLICATIONS

G. Hawley, ed., *The Condensed Chemical Dictionary*, 10th Edition Van Nostrand Reinhold Co., 1981 (no month), p. 700.

Oguri et al., "Effect of excess carbon on the hardness of Si–C and Ti–C coatings formed by plasma–assisted chemical vapor deposition", *Thin Solid Films*, 186 (May 1990), L29–31.

Arai et al., "Plasma–Assisted Chemical Vapour Deposition of TiN and TiC on Steel: Properties of Coatings" *Thin Solid Films*, 165 (Nov. 1988), 139–148.

Bunshah et al., "Deposition Technologies for Films and Coatings," Noyes Publication, 1982, pp. 187–189, no month.

(List continued on next page.)

*Primary Examiner*—Marianne Padgett
*Attorney, Agent, or Firm*—Fay, Sharpe, Beall, Fagan, Minnich & McKee

[57] ABSTRACT

A composition of matter having an atomic density between that of pure diamond and at least 0.18 g-atoms per cubic centimeter and the formula:

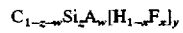

$$C_{1-z-w}Si_zA_w[H_{1-x}F_x]_y$$

where: $0 \leq z+w \leq 0.15$, $0 \leq w \leq 0.05$, $0 \leq x \leq 0.10$, $0 < y < 1.5$, and, A is boron or oxygen. Variation of the constituents and the parameters of production of the compositions in self-biasing RF cavities, or primary or secondary ion beam methods, allows formation of films of, for example, desired hardness, lubricity, density, electrical conductivity, permeability, adhesion and stress. Variation of the properties allows production of films formed by the composition as a function of depth.

19 Claims, 9 Drawing Sheets

U.S. PATENT DOCUMENTS

| | | | |
|---|---|---|---|
| 4,464,451 | 8/1984 | Shirai et al. | 430/65 |
| 4,471,016 | 9/1984 | Scholes | 428/201 |
| 4,477,549 | 10/1984 | Fujimaki et al. | 430/54 |
| 4,486,521 | 12/1984 | Misumi et al. | 430/65 |
| 4,490,229 | 12/1984 | Mirtich et al. | 423/446 |
| 4,490,453 | 12/1984 | Shirai et al. | 430/65 |
| 4,540,636 | 9/1985 | MacIver et al. | 428/610 |
| 4,594,294 | 6/1986 | Eichen et al. | 428/552 |
| 4,620,898 | 11/1986 | Banks et al. | 156/643 |
| 4,634,648 | 1/1987 | Janson et al. | 430/84 |
| 4,636,435 | 1/1987 | Yanagihara et al. | 428/336 |
| 4,647,494 | 3/1987 | Meyerson et al. | 428/216 |
| 4,693,927 | 9/1987 | Nishikawa et al. | 428/216 |
| 4,735,840 | 4/1988 | Hedgcoth | 428/65 |
| 4,737,415 | 4/1988 | Ichijo et al. | 428/447 |
| 4,770,940 | 9/1988 | Ovshinsky et al. | 428/408 |
| 4,783,368 | 11/1988 | Yamamoto et al. | 428/408 |
| 4,833,031 | 5/1989 | Kurokawa et al. | 428/336 |
| 4,839,244 | 6/1989 | Tsukamoto | 428/694 |
| 4,840,844 | 6/1989 | Futamoto et al. | 428/336 |
| 4,880,687 | 11/1989 | Yokoyama et al. | 428/141 |
| 5,017,403 | 5/1991 | Pang et al. | 427/577 |
| 5,055,318 | 10/1991 | Deutchman et al. | 427/577 |
| 5,055,421 | 10/1991 | Birkle et al. | 437/101 |
| 5,061,322 | 10/1991 | Asano | 427/577 |
| 5,064,682 | 11/1991 | Kiyama et al. | 427/577 |
| 5,084,319 | 1/1992 | Hibst et al. | 428/64 |
| 5,110,679 | 5/1992 | Haller et al. | 428/408 |
| 5,192,523 | 3/1993 | Wu et al. | 427/577 |
| 5,266,398 | 11/1993 | Hioki et al. | 427/577 |
| 5,275,850 | 1/1994 | Kitoh et al. | 427/577 |

OTHER PUBLICATIONS

Oguri, "Low Friction Coatings of Diamond–Like Carbon with Silicon Prepared by Plasma–Assisted Chemical Vapor Deposition", *J. Mater. Res.*, vol. 5, No. 11 (Nov. 1990), pp. 2567–2571.

Angus, "Ion Beam Deposition of Amorphous Carbon Films with Diamond Like Properties", Metastable Materials Formation by Ion Implantion, pp. 433–440 (1982), no month.

Forrest et al., "Semiconductor Analysis Using Organic–on–Inorganic Contact Barriers 1. Theory of the Effects of Surface States on Diode Potential and AC Admittance", J. Appl. Physics 59:2 (Jan. 1986) pp. 513–525.

Bubenzer et al., RF–Plasma Deposited Amorphous Hydrogenated Hard Carbon Thin Films: Preparation, Properties, and Applications, J. Appln.Phys. 54(8) (Aug., 1983), pp. 4590–4595.

Jansen, et al., "The Effects of Hydrogenation on the Properties of Ion Beam Sputter Deposited Amorphous Carbon", J. Vac. Sci. Technol. A3(3) (May/Jun. 1985), pp. 605–609.

Nyaiesh, "Chemisorbed Hydrogen On α–Carbon Films", J. Vac. Sci. Technol. A1(2) (Apr./Jun. 1983), pp. 308–312.

Ojha, "The Growth Kinetics and Properties of Hard and Insulating Carbonaceous Films Grown in an R.F. Discharge", *Thin Solid Films*, 60 (1979) 213–225, no month.

Venkatesan et al., "Ion Beam Induced Conductivity in Polymer Films," Bell labs Pre–print, no date.

Chemical Abstract 113–182203A, no date, issue 24, 1990, (no month given).

Aiyer et al., "Effect of Mixing Oxygen or Diborane on the Formation of Amorphous Carbon Films From Methane by R.F. Plasma Chemical Vapour Deposition", Thin Solid Films, 163, No. 1, pp. 229–232 (Sep. 1988).

Wyon et al., "Properties of Amorphous Carbon Films Produced by Magnetron Sputtering", Thin Solid Films, 122, No.3 (1984) 203–216. Dec.

Spencer et al., "Ion Beam–Deposited Polycrystalline DiamoneLike Films," Appl. Phys. Let., vol. 29, No. 2, pp. 118–120 (1976). Jul.

Future Tech. Letter, No. 73, Jan. 16, 1989 (Breifing on: Diamondlike Hydrocarbon Film).

Enke, "Some New Results on the Fabrication of and the Mechanical, Electrical and Optical Properties of i–Carbon Layers," Thin solid Films, 80, pp. 227–234 (1981), no month.

Miyazawa et al., "Preparation and Structure of Carbon Film Deposited by a Mass–Separated C+ Ion Beam," J. Appl. Phys., 55(1), pp. 188–193 (Jan. 1984).

Angus, "Categorization of Dense Hydrocarbon Films," Les Editions de Physique, vol. XVII, pp. 179–187 (Jun. 1987).

Chemical Abstract 113:182204B, no date, issue 24, 1990 (no month given).

Angus, "Low–Pressure, Metastable Growth of Diamond and 'Diamond–Like' Phases," Science, vol. 241 pp. 913–921 (Aug. 1988).

Angus et al., "Dense 'DiamondLike' Hydrocarbons as Random Covalent Networks," J. Vac. Science Technol., vol. 6, No. 3, pp. 1778–1782 (May/Jun. 1988).

Aisenberg et al., "Ion–Beam Deposition of Thin Films of DiamondLike Carbon," J. Applied Physics, vol. 42 No. 7, pp. 2953–2958 (1971).Jun.

Angus, "Empirical Characterization and Naming of 'Diamond–Like' Carbon Films," Thin Solid Films, 142, pp. 145–151 (1986), no month.

Torng et al., "Structure and Bonding Studies of the C:N Thin Films Produced by RF Sputtering Method," J. Mater. Res., vol. 5, No. 11, pp. 2490–2496 (Nov. 1990).

Cuomo et al., "Reactive Sputtering of Carbon and Carbide Targets in Nitrogen," J. Vac. Sci. Technol., vol. 16, No. 2, pp. 299–302 (1979). Mar/Apr.

Memming et al., "Properties of Polymeric Layers of Hydrogenated Amorphous Carbon Produced by a Plasma–Activated Chemical Vapour Deposition Process II: Tribological and Mechanical Properties," Thin Solid Films 143, pp. 31–41 (1986), no month.

Beauchamp et al., "Systematic Design Approach Leads to Better Optical Coatings.", Laser Focus/Electro–Optics, pp. 109–118 (May 1988).

Torng et al., "Nitrogen Sputtering Gas Effect on Carbon Thin Films" Journal of the Magnetics Society of Japan; 13:169–174 (1989), no month.

Torng et al., "Enhancement of Diamond $SP^3$ Bonding in RF Sputtered Carbon Films with Nitrogen Added", no date.

Cuomo et al., "Preparation of Paracyanogen–Like Films," IBM Technical Disclosure Bulletin, 19:2 (1976). Jul.

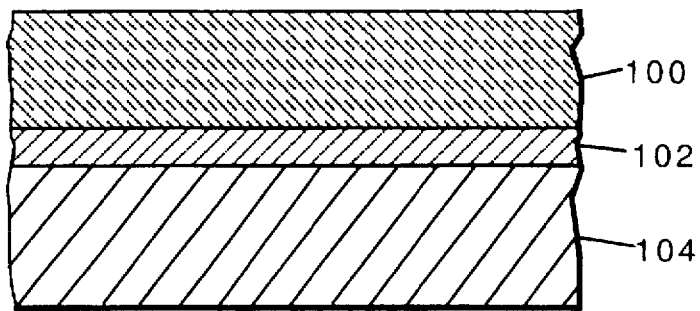
FIG. 12
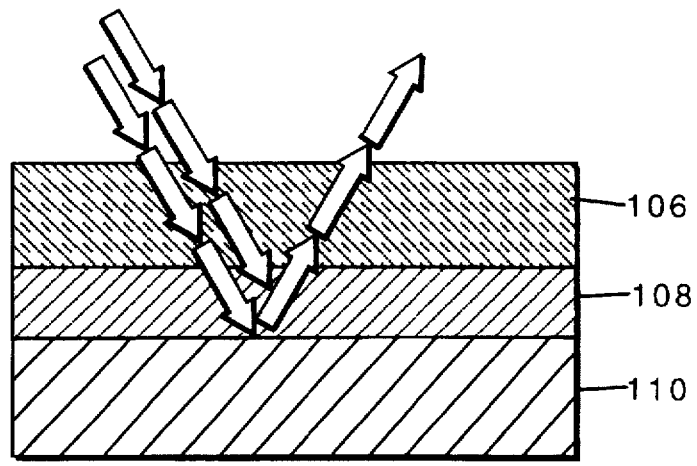
FIG. 13
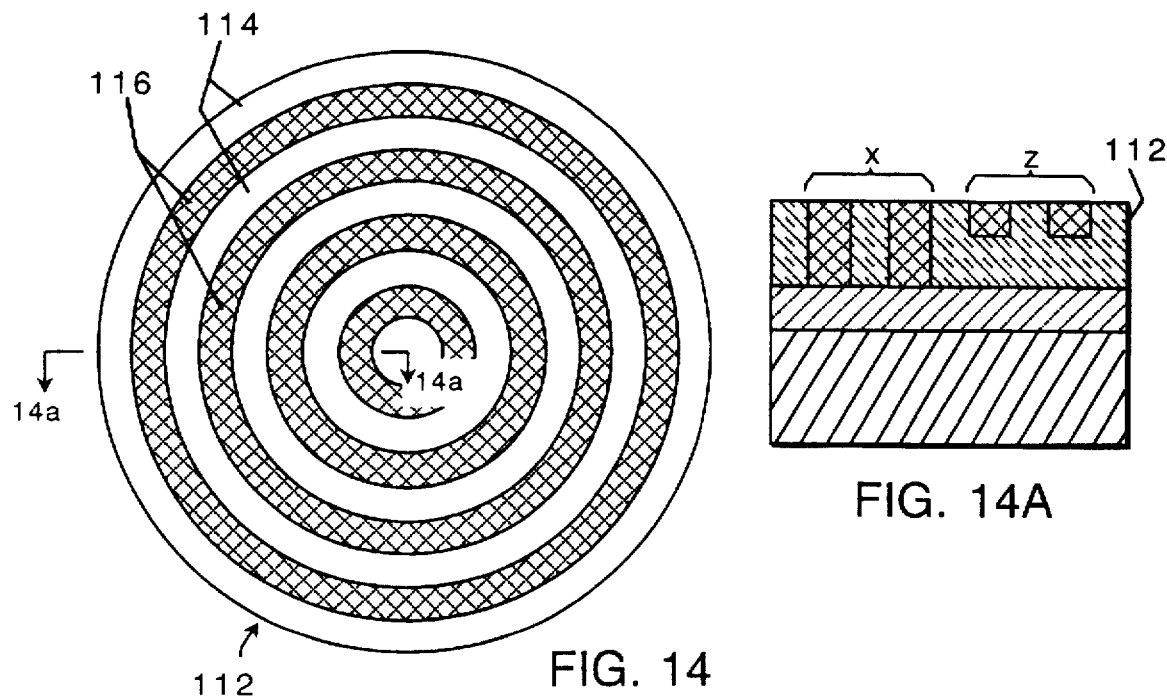
FIG. 14
FIG. 14A

5,750,210

HYDROGENATED CARBON COMPOSITION

This is a continuation of application Ser. No. 08/114,917, filed Sep. 1, 1993, now abandoned, which is a division of prior application Ser. No. 07/344,990, filed Apr. 28, 1989, now U.S. Pat. No. 5,266,409.

This invention relates to hydrogenated carbon compositions.

Hard carbon compositions are known to be obtainable from depositions in radio frequency (RF) plasma reactors, in direct current (DC) discharge, chemical vapor deposition (CVD) apparatus, or through sputter deposition in secondary ion chambers, or by direct excitation of carbon in primary ion devices.

These materials hold the potential for varied and significant utility due to the expectation that such compositions will exhibit properties similar to those of diamond, such as extreme hardness. It is known, for example, to use a hard carbon film composition in combination with a silicon adhesion layer to provide a hard coating to protect magnetic recording media.

SUMMARY OF THE INVENTION

The present invention relates to a composition of matter and a method for selecting properties such as hardness, atomic density, mass density, lubricity, wearability, electrical conductivity, adhesion, stress, permeability or crystallinity of the composition Formed, for example, in the form of a film on a substrate.

An aspect of the invention is a method for controlling any of the properties of hardness, lubricity, wearability, atomic density, mass density, permeability, electrical conductivity, stress, adhesion or crystallinity of a composition. The method includes placing a substrate in a chamber. A formation gas is controllably introduced in the chamber which includes the elements carbon and hydrogen and an optional element chosen from fluorine, silicon, boron, oxygen, argon or helium. The gas is controllably energized to have an energy on the substrate in a range from between about 30–200 eV. As a result, a composition is formed on the substrate having an density between that of pure diamond and at least 0.18 moles per cubic centimeter. The composition has the following basic formula:

where: $0 \leq z+w \leq 0.15$, $0 \leq w \leq 0.05$, $0 \leq x \leq 0.10$, $0 < y < 1.5$ and, A is boron or oxygen.

The chamber may be an RF plasma chamber, where the total gas pressure in the chamber is in a range of from 5 to 100 mtorr, the energy is the impact energy on the substrate and the energizing is controlled by controlling the RF bias voltage in a range from about 100–1500 V.

The chamber may be a vacuum chamber, where the pressure is about one millitorr and energizing is obtained by means of an ion source. The ion source may be a primary ion source where the energy is the impact energy of the gas on the target, or a secondary ion beam system where the system has a first ion beam for producing at least a portion of the gas by sputtering from a target and a second ion beam for energizing the gas after the gas impinges upon a substrate.

A feature of the invention is that the composition may be formed as a function of time, wherein the composition properties are varied to form different regions of the formed composition. The composition may be formed as a film and the properties varied as a function of film depth.

Another feature is that the properties may be varied by controlling the amount of hydrogen in the composition. The hydrogen content of the composition may be controlled by controlling the energy of the formation gas. The hydrogen content may be reduced by increasing the energy.

Yet another feature is that the energy of the gas may be controlled to control the hardness of the composition. The energy may be adjusted to a value at which the hardness becomes a maximum, relative to prior formed compositions. The chamber may be an RF plasma chamber, the formation gas comprised substantially of methane and the maximum hardness obtained at an RF bias voltage of about 500 volts.

Another feature is that the hardness may be controlled by controlling the amount of oxygen in the composition or by controlling the amount of Ar or He in the gas.

Another feature is that the lubricity may be controlled by controlling the amount of fluorine in the composition or by controlling the crystallinity of the composition. The lubricity may also be controlled by the amount of He of Ar in the formation gas.

Another feature is that the wearability may be controlled by controlling the amount of silicon in the formation gas or by controlling crystallinity of the composition. The wearability may also be controlled by controlling the energy of the gas.

Another feature is that the density may be controlled by controlling the hydrogen content of the composition or by controlling the energy of the gas.

Another feature is that the mass density may be controlled by controlling the hydrogen content of the composition or by controlling the energy of the gas.

Another feature is that the electrical conductivity may be controlled by controlling the amount of boron in the composition or by controlling the crystallinity of the composition. The conductivity may also be controlled by controlling the energy of the gas.

Another feature is that the stress may be controlled by controlling the amount of silicon, boron, hydrogen, or fluorine in the composition or by controlling the energy of the gas.

Another feature is that the adhesion may be controlled by controlling the amount of silicon or hydrogen in the composition.

Another feature is that the crystallinity may be controlled by controlling the energy of the gas or by controlling the amount of boron, silicon, or hydrogen in the composition. The crystallinity may also be controlled by controlling the amount of He or Ar in the formation gas.

Another feature is that the substrate may be a magnetic recording medium and the composition a lubricious protective coating.

Another feature is that the substrate may be a read/write transducer and the composition is applied to the air bearing surface of the transducer.

Another feature is that the properties further include optical properties, the substrate may be a recording medium and the composition may be an at least partially transmissive, lubricious, protective coating.

Another feature is that the recording medium may include a partially optically absorbing film between the composition and the substrate. The absorbing film may be chromium.

A layer of amorphous silicon may also be deposited between the composition and the substrate and may be of sufficient thickness to form a destructive interference package. The composition may include an organic light-absorbing material. The organic material may be chosen from photoresist, polyimide or hydrogenated carbon. The depth of the light absorbing material may be arranged to format the recording medium.

Another feature is that the substrate on which the composition is formed may be a magneto-optical slider.

Another feature is that the composition may be a corrosion protection film having low permeability.

Another feature is that the composition may be a low friction, low wear coating for a rotating sliding surface.

Another feature is that the composition may provide a highly smooth surface.

Another feature is that the substrate may be a metal, alloy, semiconductor, plastic or ceramic.

In another aspect, a composition of matter may be formed by the process of placing a substrate in a chamber; controllably introducing a gas in the chamber, including the elements carbon and hydrogen and an optional element chosen from fluorine, silicon, boron, oxygen, argon or helium; energizing the gas to have an energy on the substrate in a range from between about 30–200 eV, and from the energized gas, forming on the substrate a composition having an density between that of pure diamond and at least 0.18 moles per cubic centimers and having the following formula:

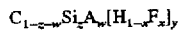

where: $0 \leq z+w \leq 0.15$, $0 \leq w \leq 0.05$, $0 \leq x \leq 0.10$, $0 < y < 1.5$ and, A is boron or oxygen.

In yet another aspect, a method for producing a composition of matter is provided comprising placing a substrate in a chamber; controllably introducing a gas in the chamber including the elements carbon and hydrogen and an optional element chosen from flourine, silicon, boron, oxygen, argon or helium and energizing the gas to have an impact energy on the substrate in a range from between about 30–200 eV, and from the energized gas, forming on the substrate a plurality of molecules, at least some of which having an density between that of pure diamond and at least 0.18 moles per cubic centimeter and having the formula:

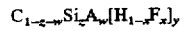

where: $0 \leq z+w \leq 0.15$, $0 \leq w \leq 0.05$, $0 \leq x \leq 0.10$, $0 < y < 1.5$, and, A is boron or oxygen;
where the average of the molecules so formed have the above formula where: $0.05 < y < 0.18$.

The chamber may be a primary ion beam chamber and the composition produced by variation of the plasma gas in the chamber.

In another aspect, the invention provides a composition of matter having an density between that of pure diamond and at least 0.18 moles per cubic centimeter, and the following formula:

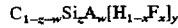

where: $0 \leq z+w \leq 0.15$, $0 \leq w \leq 0.05$, $0 \leq x \leq 0.10$, $0 < y < 1.5$ and, A is boron or oxygen.

The composition may further include graphite-like regions of short range atomic order. The composition may also form a film on a substrate, where the properties of the film vary as a function of location in the film. The film may be a graded film and the properties of the film vary as a function of the depth of the film.

In other aspects, the composition may be defined by: $0 < z+w < 0.15$, $0 < w < 0.05$, $0 < x < 0.10$ and $0 < y < 1.5$.

In other aspects, the composition may be defined by $0 < y < 0.18$ or $0.05 < y < 0.18$ or on average it may be $0.05 < y < 0.18$.

Yet another aspect of the invention is a transducer, having an operative surface to be operated as an air bearing, and including a coating applied to the surface, the coating having an density between that of pure diamond and at least 0.18 moles per cubic centimers and the following formula:

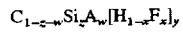

where, $0 \leq z+w \leq 0.15$, $0 \leq w \leq 0.05$, $0 \leq x \leq 0.10$, $0 < y < 1.5$, and A is boron or oxygen. The coating may include a liquid lubricant, such as a fluorocarbon lubricant applied to its surface.

Other advantages and features will become apparent from the following description of the preferred embodiment and from the claims.

DESCRIPTION OF THE PREFERRED EMBODIMENTS

We first briefly describe the drawings.

FIG. 12 is a cross-sectional side view of a segment of a disk recording medium adapted according to the invention to remove induced electrostatic charge.

FIG. 13 is a cross-sectional side view of a segment of a disk recording medium configured as a destructive interference package according to the invention.

FIG. 14 is a plan view of a formatted thermo-magneto-optical disk according to the invention.

FIG. 14a is a cross-sectional side view of the disk shown in FIG. 14 taken along line 14a—14a.

FORMATION AND CONTROL OF PROPERTIES

We have discovered that certain amorphous, carbonaceous compositions of matter can be produced with desirable properties. In some embodiments, this is achieved by incorporating select additives and by carrying our formation under select conditions.

Specifically, these compositions have an density from between about that of pure diamond and at least 0.18 moles per cubic centimeter and the formula:

$$C_{1-z-w}Si_zA_w[H_{1-x}F_x]_y \qquad (1)$$

where: $0 \leq z+w \leq 0.15$, $0 \leq w \leq 0.05$, $0 \leq x \leq 0.10$, $0 < y < 1.5$, and, A is boron or oxygen.

Generally, the elements C, Si, O and B are considered network forming elements because they have valences greater than one, i.e., they can form bridges and cross-links in the basic structural network. The hydrogen and fluorine have only one bond and therefore can only serve as network terminating elements. A general formula for the compounds described herein might be written:

$$NT_y \qquad (2)$$

where N is a network atom with valence of two or more (i.e., N=C,Si,B or O), T is a terminating atom with a valence of one (H or F). This general analysis is thought to hold for: $0.18 < y < 1.5$.

By variation of the relative amount of the elemental constituents and by variation of the parameters for formation of the compositions, the properties of the composition may be varied to exhibit desired properties. These properties include, lubricity, wearability, hardness, density, mass density, electrical conductivity, stress, adhesion, permeability and crystallinity.

Figure 1:
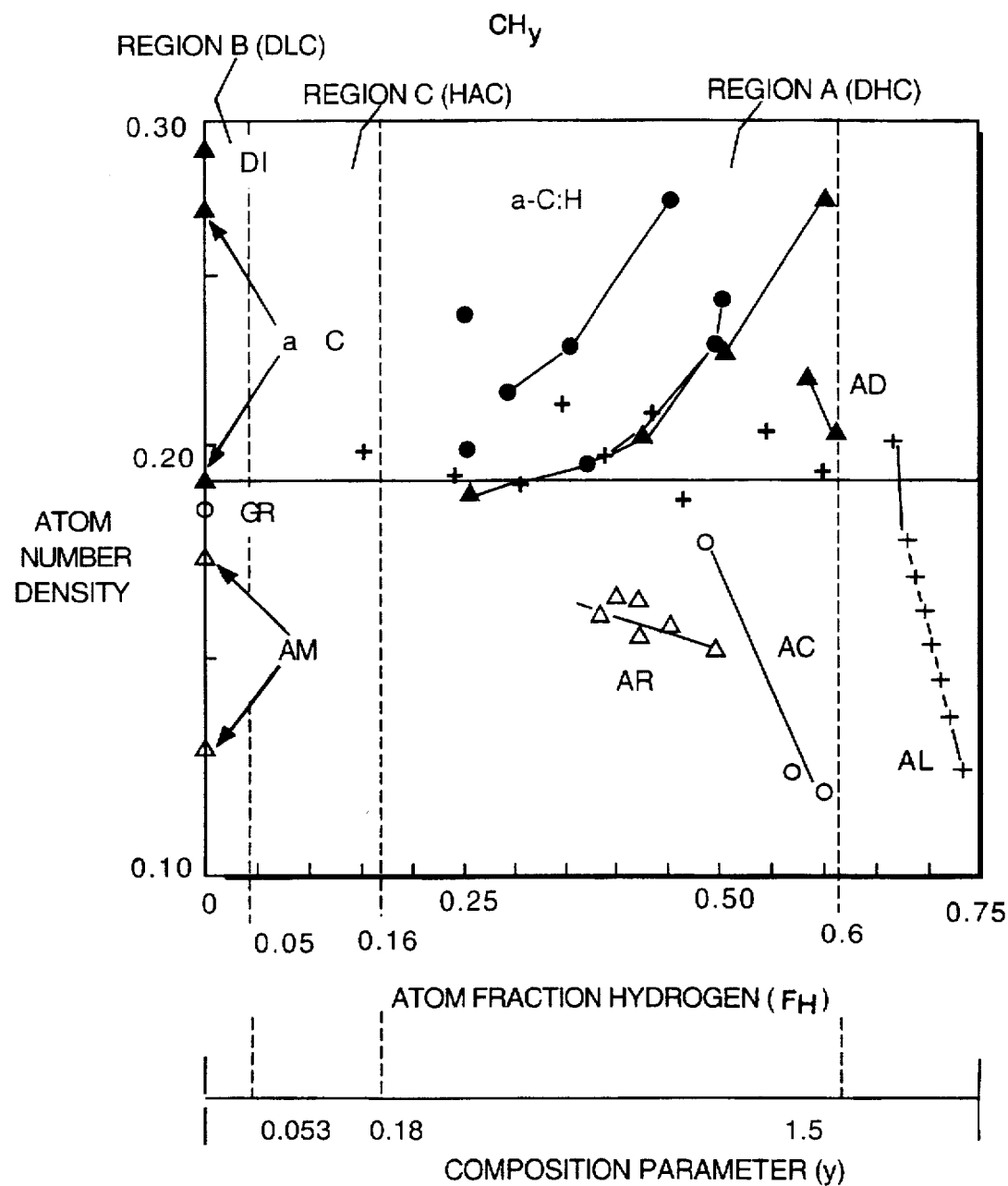
FIG. 1 is a diagram indicating the density (in moles per cubic centimeter) of compositions encompassed by the invention for the simplest case, where the composition may contain only carbon and hydrogen.

Referring to FIG. 1, a plot of density, in mole density per cubic centimeter versus the atomic fraction of hydrogen ($F_H$), is shown, which characterizes carbonaceous compositions. The regions labeled A, B and C represent the limits in the specific formula (1), above, in the simplest case, where the composition includes only carbon and hydrogen, i.e. subscripts x and z are zero.

Also in FIG. 1, the relationship between the atom fraction of hydrogen and the composition parameter y is shown on the horizontal bar below the figure. The algebraic relation between $F_H$ and y is:

$$F_H = y/(1+y).$$

The region labeled A represents compositions of density from between about that of pure diamond (DI in FIG. 1) and about 0.18 moles per cubic centimeter (cc) and hydrogen fraction $F_H$ from about 0.16 to about 0.6. Region B represents compositions from between about slightly greater than 0 and 0.05 hydrogen fraction with a density greater than 0.18 moles per cc. Hereafter, the compositions within region A will be referred to as dense hydrocarbon compositions (DHC) and the compositions within region B will be referred to as diamond-like carbon compositions (DLC).

The region having a hydrogen fraction greater than region B but less than region A, i.e., $F_H$ from about 0.05 to 0.16, and a density greater than 0.18, is labelled region C, and hereafter is referred to as Hard Amorphous Carbon (HAC). It is one attribute of the present invention that we can provide average compositions falling within this range and a further attribute that we can provide average HAC compositions having desired properties.

As shown in FIG. 1, the DHC, DLC, and HAC compositions are considerably more dense than common organic compounds, such as, for example, amorphous carbon (AS) or condensed ring aromatics like anthracene (AR). These latter compounds fall within the same elemental range but are far less dense than the compositions formed in practice of the present invention.

It will be understood, where the compositions include various additives as defined by formula (1), above, the DLC, DHC and HAC may be defined by the composition parameter, y. Approximately, DLCs range $0 < y < 0.05$; HACs range $0.05 < y < 0.18$; and DHCs range $0.18 < y < 1.5$.

Figure 2:
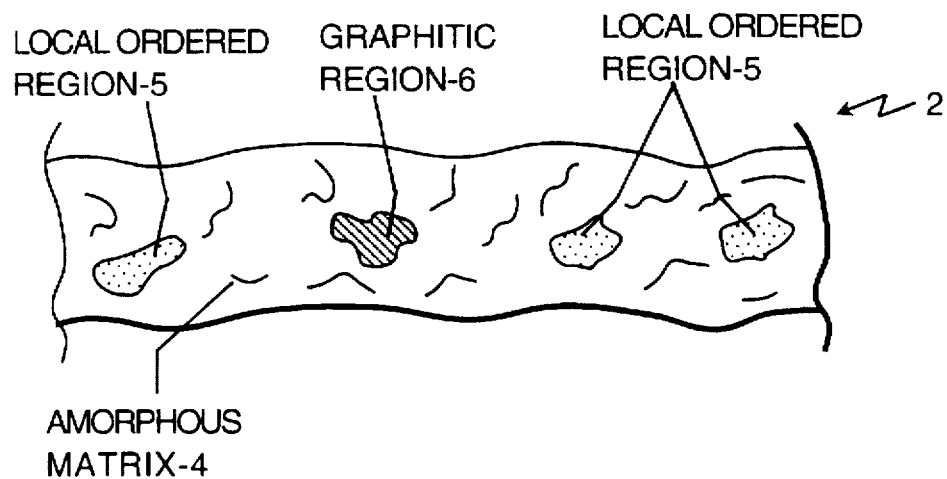
FIG. 2 is a schematic view of an amorphous matrix according to the invention that shows local regions of short range atomic order.

Referring now to FIG. 2, a schematic view of a film 2 formed according to the invention is shown. The film composition preferably includes an amorphous matrix 4 with regions 5,6 of short range atomic order. For example, amorphous matrix 4 may include local-ordered regions 5 or graphite-like regions 6. The graphite-like materials are generally have short-range atomic order and $Sp^2$ carbon sites.

The number and type of regions in the films formed can be varied according to the invention to effect desirable properties. In some compositions, crystallinity may be controlled such that it is generally not observed by transmission electron microscopy (TEM).

The DLC, DHC, or HAC compositions may be formed, preferably, by using an RF self bias chamber or a primary or secondary ion beam deposition system. In any of these methods, the energy of the formation gas when impacting a substrate is preferably controlled between about 30–200 V. The formation gas, as referred to herein, is broadly defined, and could be the gas introduced into an RF plasma chamber, or either ions accelerated in an ion beam or a gas introduced within an ion beam chamber when producing the composition by primary or secondary ion beam techniques. The formation gas may exist in space or upon a substrate at the time it is energized. In secondary ion beam methods, the formation gas may include species sputtered from a target.

The gas pressure and the bias voltage may be varied to vary the impact energy of species, i.e., molecules, atoms and ions in the formation gas. For example, in the RF self-bias method, at a typical plasma pressure of about 50 mtorr, the bias voltage may be varied between 100–1500 V. In the case of the ion beam method, the energy may be substantially the energy of accelerated species in the beam.

It is believed that the energy at which the formation gas impacts the substrate affects the properties of the formed composition by influencing both the amount of hydrogen in and the physical makeup of the formed composition. As the impact energy increases, collision effects tend to sputter and remove the low mass hydrogen from the forming composition. At very high impact energies, the structure of the forming composition is altered to produce regions of short range atomic order. These regions may include regions 6 of graphite-like crystallinity. Above certain, very high energies, the compositions become very soft and generally not useful as protective films. Reducing the hydrogen consent of the film (by increasing the energy) will, for example, increase the hardness of the film. This trend is true only to energies where the hydrogen reduction is the dominant effect. At energies where large numbers of graphite-like regions are produced, the film becomes softer.

Non-carbon additives such a silicon, boron, fluorine or oxygen can be introduced into the forming composition to form a composition having desirable properties. Certain additives, such as He or Ar, can be added to the formation gas to affect the properties of the forming composition. It is not believed that these inert gases are substantially incorporated into the formed composition. The non-carbon species can be incorporated into the formation gas.

Thus, the elemental constituents in the composition itself and the conditions under which the composition is formed may be varied to exhibit desired properties in the formed composition according to the present invention. Examples are given in Table I.

As seen in the table, the hardness of the compositions may be controlled by controlling (generally, increasing) oxygen, reducing the hydrogen content or reducing the graphite-like crystallinity. Process parameters which enhance hardness include controlling (generally, increasing) the amount of oxygen, helium or argon in the formation gas or adjusting the impact energy of the formation gas on a substrate.

The lubricity of the compositions may be enhanced by controlling (generally, increasing) the amount of fluorine in the film, or increasing regions of The process parameters which may enhance conductivity are controlling (generally, increasing) boron-containing compounds in the formation gas or increasing the RF bias voltage above 1000 volts.

The stress of a film of the composition may be reduced by controlling (generally, increasing) boron or silicon, or by reduction of the amount of hydrogen or fluorine in the composition. The process parameters which reduce the stress are controlling (generally, increasing) boron or silicon-containing compounds in the formation gas or increasing the RF bias voltage up to about 1000 volts. In an ion beam formation process, the ion beam voltage might be increased up to about a mid-range voltage of 200 or 300 volts, for example. The amount of fluorine-containing compounds in the formation gas may also be controlled (generally, reduced).

TABLE I

Enhancement of Film Properties in RF and Ion Beam Processes

| Property Enhanced | Film Composition Parameters | Process Parameters |
|---|---|---|
| Hardness | Control oxygen | Control oxygen, He or Ar in formation gas, |
|  | Reduced hydrogen | Adjust impact energy of formation gas, |
|  | Reduce graphite-like crystallinity | (maximum hardness at 500v RF bias at typical pressures). |
| Lubricity | Control fluorine | Control fluorine containing components in formation gas |
|  | Increase regions of graphite crystallinity | Control He or Ar in RF plasma |
| Wearability | Control silicon | Control silicon containing compounds in formation gas |
|  |  | Increase RF bias voltage up to intermediate value (e.g., 500v) |
|  |  | Increase ion beam voltage up to intermediate value (e.g., 100v) |
| Atomic Density | Increase hydrogen | Reduce impact energy |
| Mass Density | Intermediate hydrogen content | Use intermediate bias voltages (approx. 500v) |
| Electrical Conductivity | Increase boron | Increase boron containing components in formation gas |
|  | Increase graphite-like crystallinity | Increase RF bias voltage above 1000 v |
| Stress (reduce) | Control boron or silicon | Control boron or silicon containing compounds in formation gas |
|  | Reduce hydrogen |  |
|  | Reduce fluorine | Increase RF bias voltage up to 1000 v or under 100v and a mid-range ion beam voltage |
|  |  | Control fluorine containing compounds in formation gas |
| Adhesion | Control silicon | Control silicon containing gases in formation gas |
|  | Reduce hydrogen | Control RF bias voltage |
| Crystallinity | Control boron | Control He, Ar or boron in formation gas |
|  | Reduce hydrogen | Increase the impact energy | graphite-like crystallinity. Process parameters which enhance lubricity include controlling (generally, increasing) the fluorine-containing compounds in the formation gas and/or including helium or argon in the formation gas in an RF plasma.

The wearability may be enhanced by controlling (generally, increasing) the amount of silicon in the composition. The process parameters for enhancing wearability include controlling (generally, increasing) the amount of silicon containing compounds in the formation gas or, in the case of an RF plasma system, increasing the RF bias voltage up to an intermediate value (e.g., 500 v) or, in the case of an ion beam formation, increasing the ion beam voltage to an intermediate value, about 100 volts.

The density may be enhanced by increasing the amount of hydrogen in the composition or reducing the impact energy of formation gas particles impacting the substrate. The mass density is increased by incorporating an intermediate amount of hydrogen in the composition and using intermediate RF bias voltages (in a preferred embodiment, approximately 500 volts).

The electrical conductivity of the composition can be enhanced controlling (generally, increasing) the amount of boron or increasing graphite-like regions of crystallinity.

The adhesion of a film formed in practice of the invention may be enhanced by controlling (generally, increasing) silicon or by reduction of hydrogen in the composition. Process parameters for enhancing adhesion include controlling (generally, increasing) silicon-containing species in the formation gas or controlling the RF bias voltage.

The crystallinity (e.g., graphite-like) can be enhanced by controlling (generally increasing) boron or by reduction of hydrogen in the compositions. Process parameters which enhance crystallinity include controlling (generally, increasing) helium, argon or boron-containing species in the formation gas, or increasing the impact energy.

Other properties, for example, wetability, optical transparency, thermal conductivity, and permeability can also be controlled, although not shown in Table I. For example, wetability is increased by the reduction of fluorine and/or addition of oxygen in the composition. Optical transparency is increased by adding hydrogen, and thermal conductivity increases as hardness increases.

Controlling the amorphous nature of the film toward crystallinity increases the permeability of the film, since permeation through defects such as grain boundaries in a crystalline composition is generally faster than through the bulk of a dense amorphous film.

It should also be understood that control of formation parameters and of elemental additives to the composition or formation gas may include control within a range. It may also include controlling such that enhancement of a given property is maximized under certain conditions. For example, an optimal amount of an additive in the formation gas or amount of energy in the formation gas may cause some properties to be maximally enhanced.

As is evident from Table I, the physical and chemical makeup of the composition may be varied to effect the desired properties.

Figure 3:
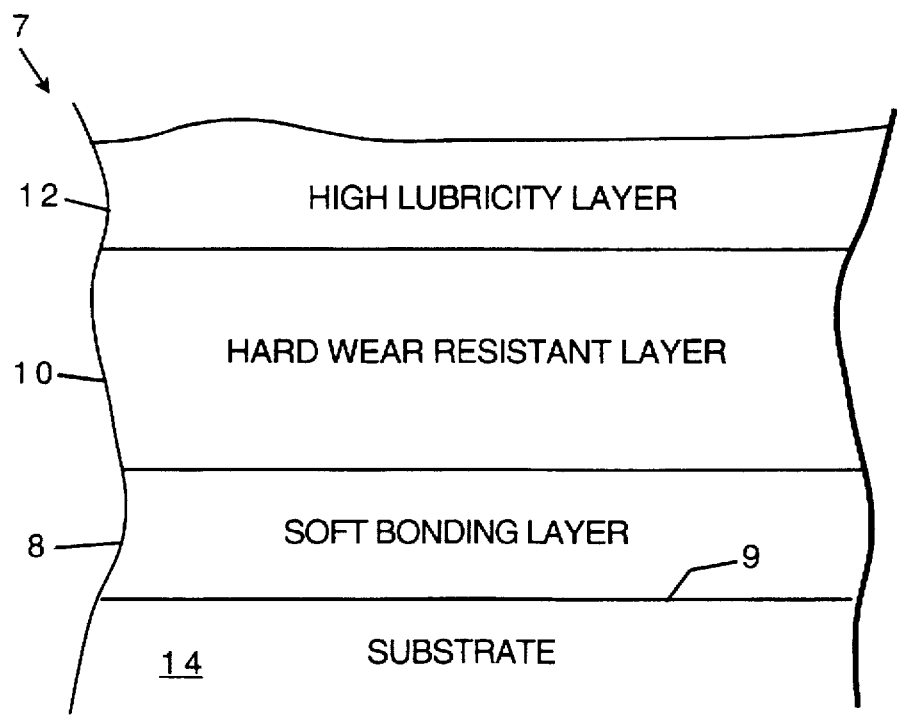
FIG. 3 is an engineered film with the composition and properties varied in different regions of the film.

As shown in FIG. 3, in practice of the invention, films can be produced with varying composition and properties as a function of film region or, as shown, film thickness. Any number of layers, or sequence of layers, can be prepared in practice of the present invention, although only three layers are shown for example only. The boundaries between these layers can be abrupt or graded.

The single film 7 in FIG. 3 has a three layer structure and is deposited on a substrate 14, for example, by an RF plasma discharge. The first layer 8 is a thin, soft, low stress composition to permit the reduction of stress at an interface 9 between film 7 and substrate 14 and consequently to promote adhesion and suppress delamination. This bonding layer is preferred, but not essential, and is preferably formed by deposition with self-bias voltage in an RF discharge under 100 volts (Table I, softer film, less stress, better adhesion) at typical pressures and may include silicon (less stress, better adhesion).

A middle layer 10 of hard, wear resistant material is then provided, by continuing the deposition, but, for example, at an intermediate (e.g. 500 V) bias and by, for example, the addition of oxygen or silicon to the plasma (Table I). The outer exposed layer 12 provides enhanced lubricity, for example, by continuing deposition at an intermediate (500 V) bias voltage with addition of a fluorine-containing gas to the plasma to provide a low friction surface (Table I).

The film produced is therefore engineered to have desired Properties in various regions, or as in the example of FIG. 3, depths. The film may thus be optimized for a given application. In FIG. 3, the lower layer is highly adhesive for attachment to a substrate while the opposite, top layer, is highly lubricious for ease of sliding contact with other surfaces. The middle layer provides a hardness which resists wear and aids the film in maintaining dimensional stability.

Any of the methods for controlling properties can be employed to produce such engineered films. For example, by simply controlling the impact energy, a soft, low stress, more crystalline layer (high energy) could be formed followed by a hard, wearable layer (moderate energy).

RF Self-Bias

Figure 4:
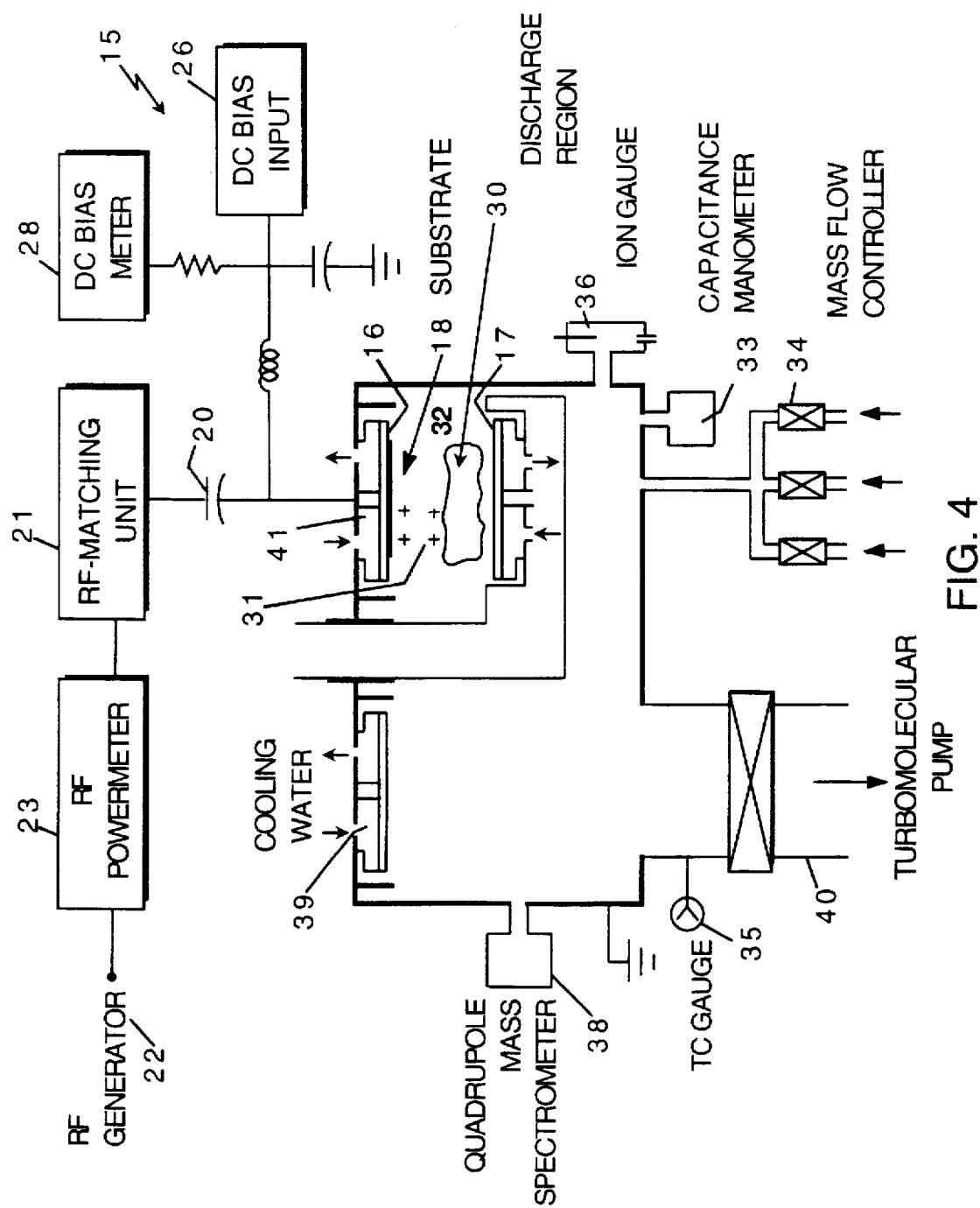
FIG. 4 is a schematic of an RF plasma deposition apparatus.

Referring to FIG. 4, an RF self-biased plasma chamber 15 for producing DLC, DHC, and HAC is shown. The upper electrode 16 carries the substrate 18 and is coupled (through capacitor 20) to an RF power generator 22. As known, an RF power meter 23 and matching unit 21 may be employed, with the input from capacitor 20 biased by a DC bias input 26 which is in turn metered 28.

An RF discharge region 30 is maintained in the chamber which is filled with the formation gas including the constituents of the desired composition in correct proportions. For example, methane, $CH_4$, may be used. For adding other species to the film, a gas containing the desired element is introduced to the plasma. Addition of argon also helps sustain the discharge. Argon is typically added in a range of: $Ar/CH_4=0.10$. Silicon is typically added at $CH_4/SiH_4=100$ and oxygen added at $CH_4/CO_2=50$, 10 or 1, for example.

It is believed that, because of the great difference in mobilities of the ions and electrons formed in the plasma, the electrons have an initial tendency to carry a greater share of the current than the positive ions. However, the electrodes develop a negative bias just sufficient to maintain the average current flowing through the system equal to zero. The average negative bias of the electrodes serves to repel the electrons during part of the RF cycle. This lowers the fraction of the current carried by the electrons so it is equal to the current carried by the positive ions. For an asymmetric system with a small powered electrode 16 and large grounded electrode 17, the average negative self-bias on the powered electrode is approximately one-half the peak-to-peak RF voltage. This negative bias attracts the positive ions toward the electrodes.

Positive ions 31 from the discharge region 30 are accelerated across the sheath region 32 and impact on the substrate 18. The apparatus includes a manometer 33, thermocouple gauge 35, flow meters 34 for control of gas inflow, an ion gauge 36 for pressure measurement and a mass spectrometer 38 for monitoring the gas composition in the chamber. Cooling water 39 and circulating unit 41 are provided to allow control of the temperature of substrate 16 during deposition which may further affect the properties of the composition. A preferred embodiment of the present apparatus uses a turbomolecular pump 40 for evacuation of the chamber.

The RF system may be operated to vary the energy of the gas particles impacting the substrate. On the one hand, if the discharge 30 includes, for example, an inert gas such as helium, at low pressures (e.g., less than one millitorr) and at high applied RF potentials (e.g., 1500 V), a high impact energy of the accelerated ions may be obtained and a net sputtering of the electrode occurs. On the other hand, under conditions of higher pressure (e.g., 50 millitorr) and lower RF voltage (e.g., less than 1000 V), the ions experience an increased number of collisions in the sheath and a lower accelerating voltage. This results in a decreased impact energy. If the particle ions or energetic neutrals hitting the surface contain elements which can form a solid phase, then net deposition rather than sputtering can occur. Thus, the particles are energized to levels as high as 1000 volts but subsequent collision reduces the actual impact energy of the particles.

The source gas may be comprised of largely carbon and hydrogen, for example, $CH_4$, and, consequently, the ions hitting the surface are primarily molecular hydrocarbon ions of the form $C_mH_n^{+z}$. These ions, together with neutral hydrocarbon species that are also hitting the surface, form the DLC, DHC, or HAC compositions or films. For example a film of 67% carbon and 33% hydrogen, having a density of 0.2 moles per cubic centimeter is a typical DHC composition according to the invention. A typical DLC composition includes 95% carbon, 5% hydrogen and has a density greater than 0.2 moles per cubic centimeter. A typical HAC could have an average composition of 10% hydrogen and a density greater than 0.2 moles per cubic centimeter.

To produce an HAC film, the plasma gas composition is alternately switched between DLC and DHC conditions. The time average of the formation gas results in a composition which has, on average, a hydrogen fraction between DLC and DHC, yet still maintains a density greater than about 0.18. Compositions in this region have been thought to be theoretically forbidden, as discussed in Angus and Jansen, *Journal of Vacuum Science and Technology*, A6 (3), pp. 1778–1782, May/June 1988.

The RF self-bias method has several very significant advantages. Because of the RF field, the substrate goes positive during part of the cycle and consequently charge does not build up. Thus, non-conducting films can be grown. Also, particle collisions lead to enhanced film uniformity.

This method has several other practical advantages. The key deposition parameters of average impact energy and plasma composition are easily controlled. Also, pinhole formation is minimized because the average negative bias of the substrate repels dust particles, which acquire a negative charge when in contact with a plasma. Depositions may also be carried out at relatively low substrate temperatures by cooling the substrate, for example, using cooling water and a circulating system. The temperature of substrate is typically thought to be less than about 150°–200° C. Deposition on a cool substrate may be important when coatings are applied to sensitive surfaces such a magnetic recording media, which may be damaged by high temperatures.

For formation of compositions including constituents other than carbon and hydrogen, a gas including the desired elemental constituent is bled into the chamber at the desired level. For inclusion of fluorine, the source gas may be comprised of methane, $CH_4$, and trifluoromethane, $CHF_3$. Consequently, a solid film containing the elements C, H and F can be formed on the substrate. In order to incorporate Si, silane may be used. For oxygen, carbon dioxide or oxygen gas is added. For boron, diborane is added. Generally harder, more lubricious films can be produced by addition of helium Table I, where the composition and properties of the deposited film can be controlled by controlling the composition of the source gases used in the discharge.

Multilayer films with different composition such as shown in FIG. 3 can be grown, for example, by changing the source gas composition during a run. This ability to grow multilayer films gives great flexibility in achieving desired properties.

Referring now to Table II, variation of properties of films which may be produced by the RF method by variation of the operating parameters and composition will be discussed. In Table II, nine examples (a–i) are discussed. Qualitative reference to a property is relative to the condition of example (c) unless otherwise indictated.

As stated earlier herein, the energy of the formation gas can affect the properties. Examples (a)–(c) are produced with the same gas composition and pressure conditions but different RF bias voltages. At voltages less than 100 V, example (a), and more than 1500 V, example (b), softer films are produced compared to example (c), where the bias voltage is 500 V and which produces a harder film (see also, FIG. 7). Thus, the hardness of the film may be controlled by controlling and adjusting the bias voltage or impact energy of the formation gas on the substrate.

TABLE II

Properties of Films Produced at Different Conditions by RF Self Bias Method

| Example | RF Bias Voltage | Gas Composition | Gas P | Composition Properties |
|---------|-----------------|-----------------|-------|------------------------|
| a) | less than 100v | $CH_4$ | 50 mtorr | Softer film, lower stress, higher thermal expansion, low refractive index, less optically absorbing, less conducting |
| b) | more than 1500v | $CH_4$ | 50 mtorr | Softer film, more conducting, more optically absorbing, higher thermal expansion, higher refractive index, low breakdown voltage |
| c) | 500v | $CH_4$ | 50 mtorr | Hard films low wear, smooth, amorphous, low permeability, high thermal conductivity, strong, defect free |
| d) | 500v | $CH_4/CF_3 = 50$ | 50 mtorr | Higher lubricity than run c or e, lower stress on Co—Ni disk than e, smooth, amorphous, lower permeability, chemically inert, higher thermal conductivity |
| e) | 500v | $CH_4/CF_3 = 1$ | 50 mtorr | Higher lubricity, higher stress on Co—Ni disk than d, smooth amorphous, low permeability, chemically inert, higher thermal conductivity |
| f) | 500v | $CH_4/SiH_4 = 100$ | 50 mtorr | Higher wearability than c, smooth, amorphous, low permeability, chemically inert, higher thermal conductivity, stronger |
| g) | 500v | $CH_4/CO_2 = 10$ | 50 mtorr | Harder films |
| h) | 500v | $CH_4$/diborane | 50 mtorr | More conductive, softer, more optically absorbing, less chemically inert |
| i) | 500v | $CH_4$/He or $CH_4$/Ar | 50 mtorr | Harder films, more lubricious | or argon to the gas compositions. In this later example, it is thought that these elements are not an important component of the film but rather affect film properties and morphology mainly by ion bombardment as the film grows. For growing films containing only carbon and hydrogen, a source gas of pure $CH_4$ may be used.

Thus, the gas composition may be primarily $CH_4$ with additions of one or more of other desired gases, for example, 2% $CHF_3$, 1% $SiF_4$, 1% $B_2H_6$, 10% $H_2$, 10% $CO_2$, 50% He or 50% Ar. These gas percentages are examples that result in films with useful properties as discussed with respect to Additionally, a film at 1500 V is more optically absorbing in the visible region and more conducting.

Referring to examples (d) and (e), the addition of fluorine to the composition by the addition of $CHF_3$ to the gas composition results in higher lubricity. However, addition of too high a ratio, example (e), produces a stressed film when applied to a Co—Ni magnetic storage disk substrate.

Addition of silicon by use of silane, as in example (f), results in a film with higher wearability. In example (g), it is shown that addition of oxygen to the plasma gas increases hardness. In example (h), addition of diborane increases conductivity. Example (i) shows that harder film can be produced by the addition of Ar or He to the plasma gas.

The regions of crystallinity may be controlled, for example, by controlling the composition of the RF plasma gas or by controlling the energy. For example, addition of 1% diborane, $B_2H_6$, to the plasma gas increases the amount of the graphite-like crystallinity. Addition of 50% He to the plasma gas has a similar effect. Increasing the excitation energy of the particles also increases the isolated regions of crystallinity. Addition of hydrogen decreases the graphite-like crystallinity.

Figure 5:
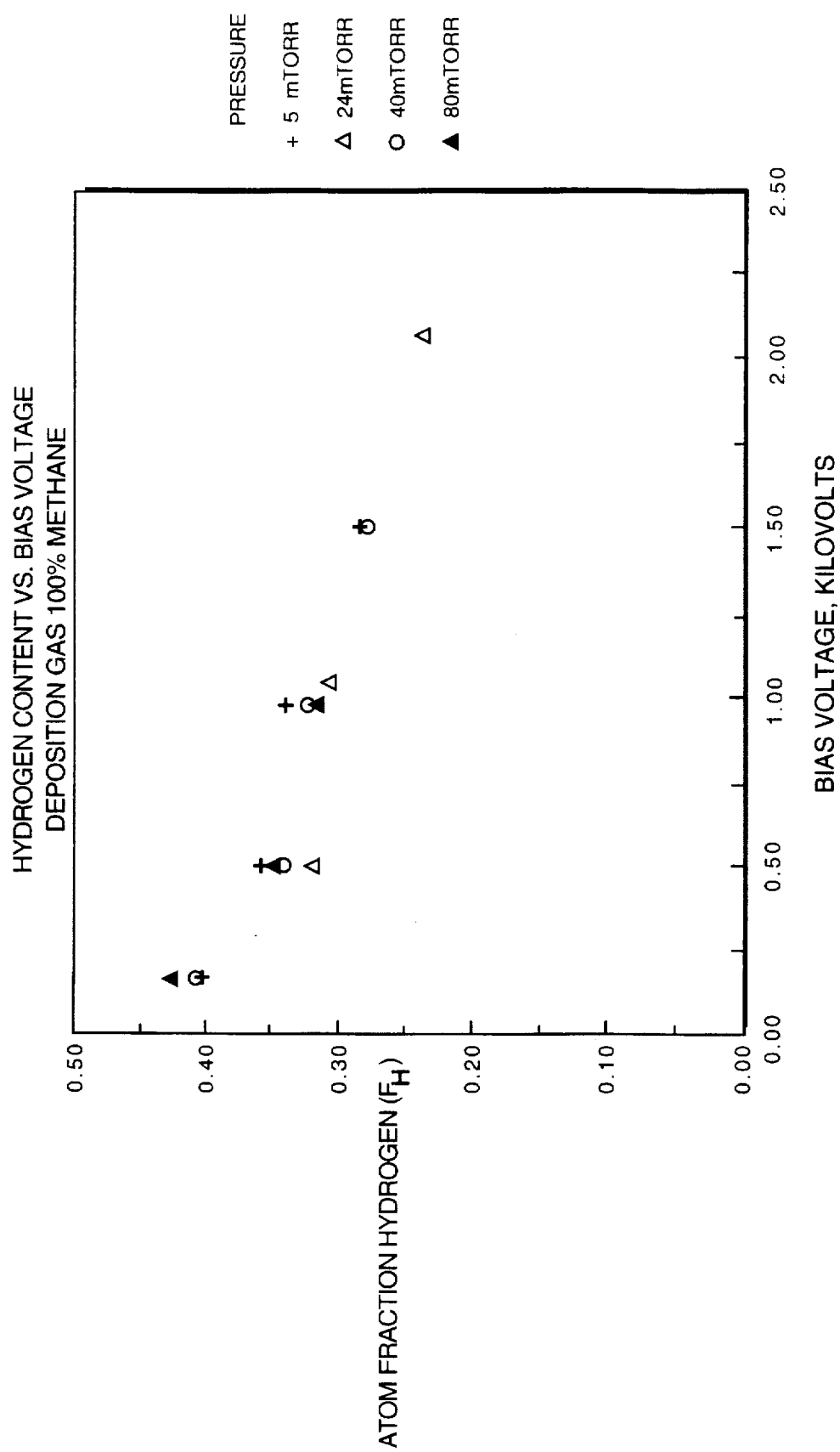
FIG. 5 is a plot of the atomic fraction of hydrogen as a function of RF bias voltage for various RF chamber pressures for a film formed by the invention.
Figure 6:
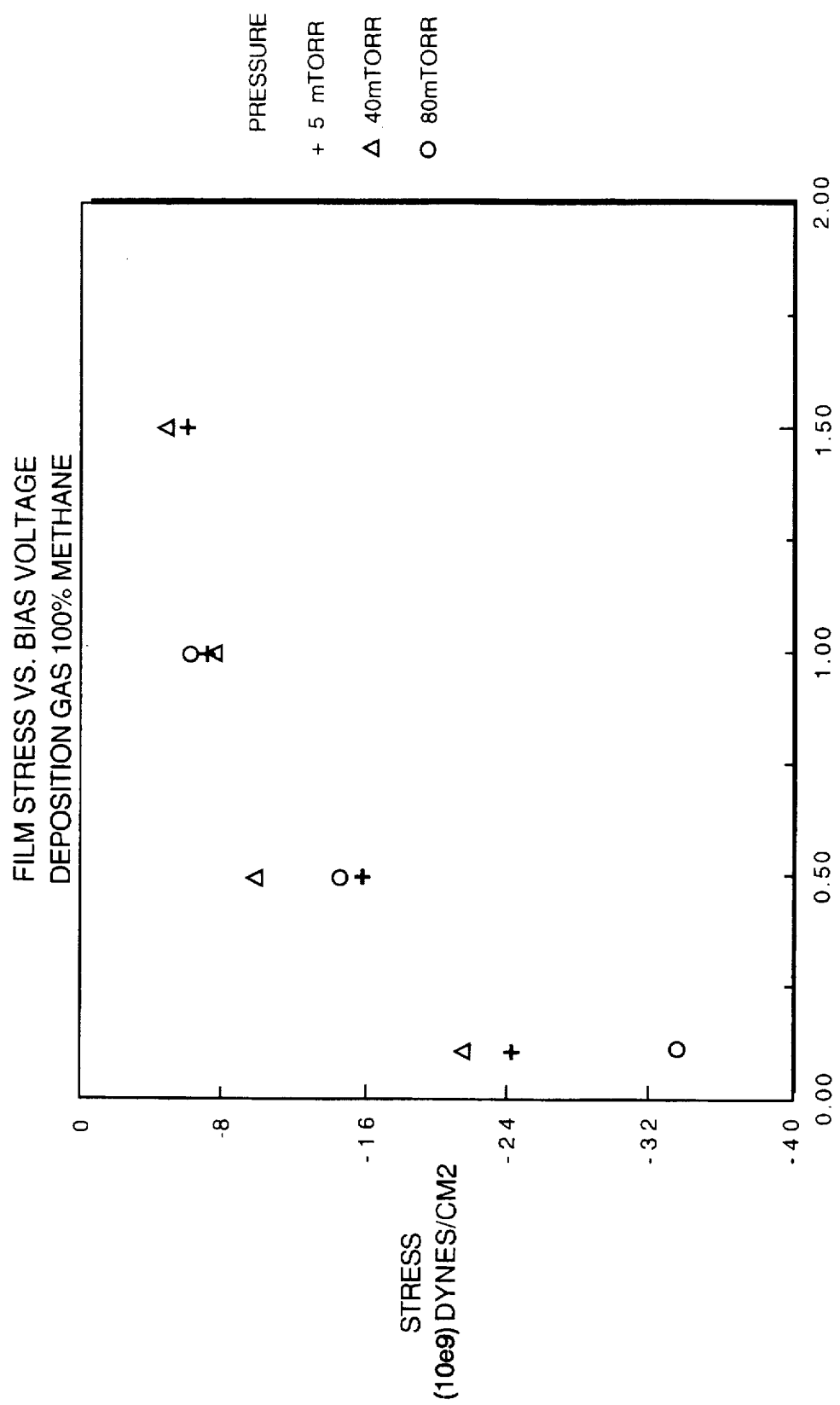
FIG. 6 is a plot of film stress as a function of RF bias voltage for various RF chamber pressures for a film formed by the invention.
Figure 7:
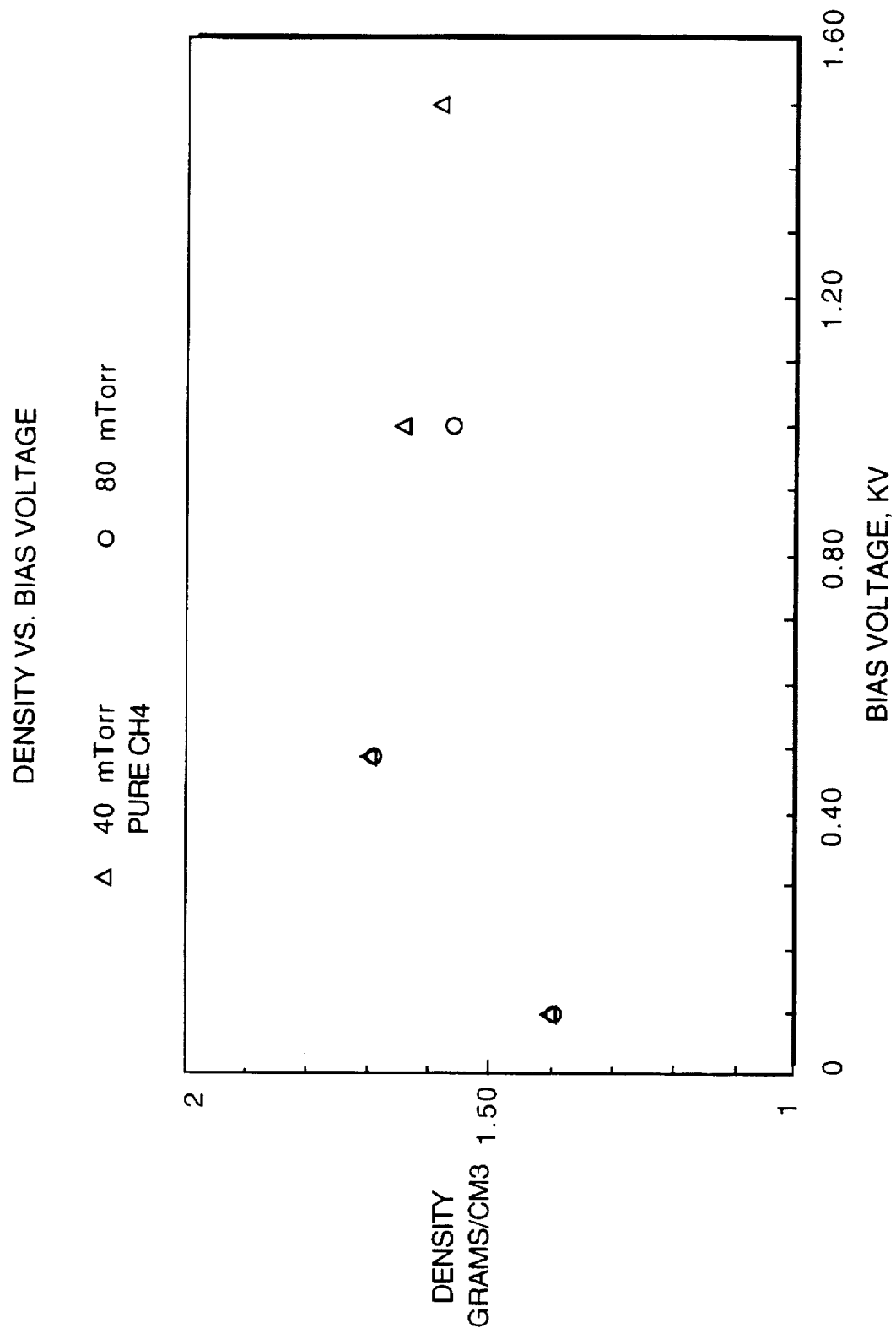
FIG. 7 is a plot of the mass density as a function of RF bias voltage for a film formed by the invention.

Examples of how the composition and properties may be varied by changing the RF plasma process parameters are given in FIG. 5, FIG. 6, and FIG. 7. In FIG. 5, the hydrogen atom fraction is plotted versus the RF self-bias voltage for several different gas pressures. It is clearly seen that increasing the bias voltage lowers the hydrogen atom fraction. Furthermore, the pressure is seen not to strongly influence the hydrogen content.

In FIG. 6, the influence of RF self-bias voltage on stress is shown. The stress becomes less negative (less compressive) as the bias voltage increases.

In FIG. 7, the influence of RF self-bias voltage on the mass density (grams/cc) is shown. In this example, the mass density is seen to reach a maximum value at approximately 0.5 kilowatts. The data of FIG. 7 illustrates how desired properties may be found at intermediate values of bias voltage. At values that are too high, i.e., greater than 1.0 kv, or too low, i.e., significantly less than 0.5 kv, the films can be made to be less dense (and less hard), as desired.

As discussed above, it is believed that the bias voltage (impact energy) influences both hydrogen content and crystallinity. After a certain high impact energy, the amount of graphite-like crystallinity in the film increases. The hydrogen content decreases with increasing impact energy. It will be understood that the maximum hardness could be obtained at other RF voltage values when using other combinations of deposition conditions.

Figure 8:
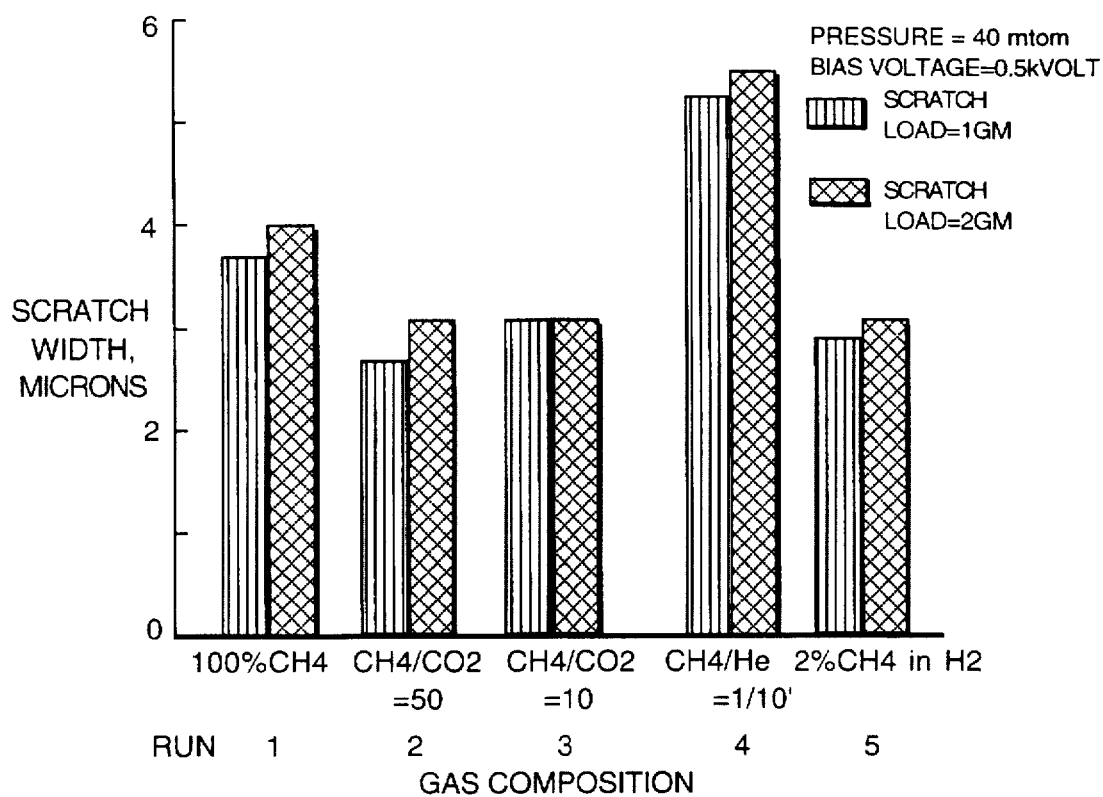
FIG. 8 is a plot of scratch width as a function of various compositions formed by the invention at 0.5 kv in an RF self-bias chamber.
Figure 8A:
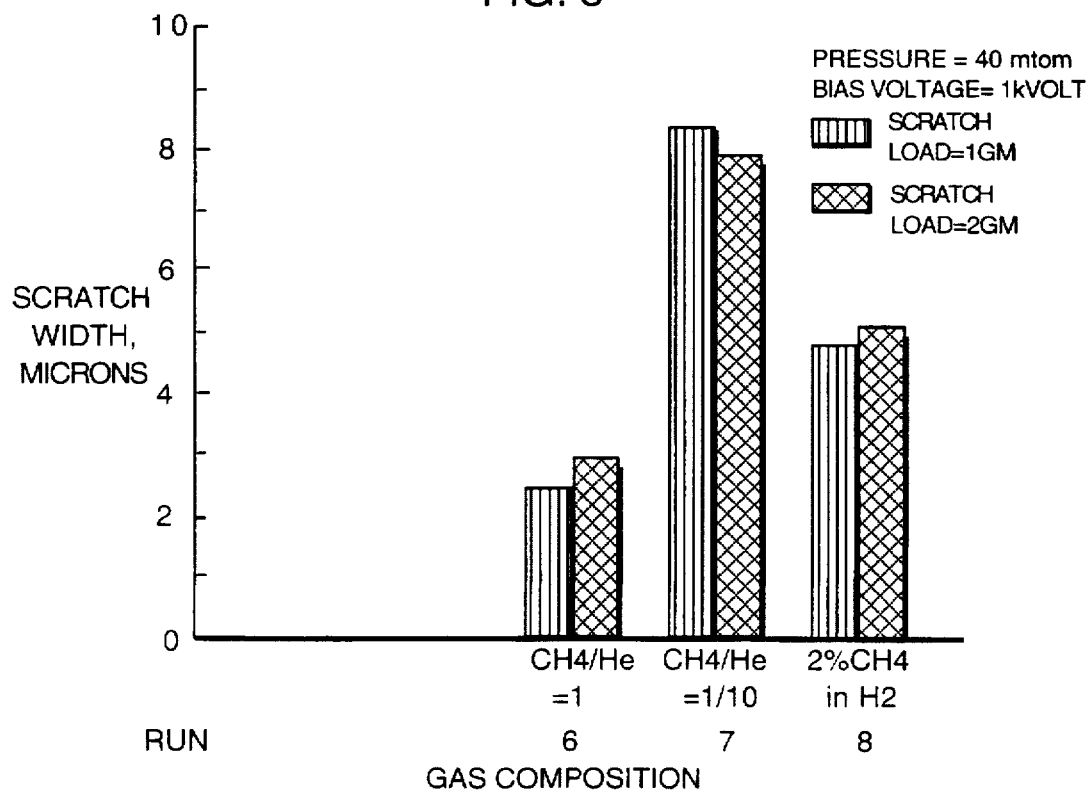
FIG. 8a is a plot of scratch width as a function of various compositions formed by the invention at 1 kv in an RF self-bias chamber.

Referring to FIGS. 8 and 8a, the results of scratch width tests of various compositions formed as films according to the invention at about 0.5 kv (FIG. 8) and 1.0 kv (FIG. 8a) are shown. The scratch width test, as is known, is a measure of the hardness of the composition. As the material gets softer, the scratch width widens. Comparison of the data generally reveals that a harder composition formed at 0.5 kv rather than at 1 kv. Runs 4 and 7 represent formation with a plasma gas composition of $CH_4/He=1/10$. The composition formed at 1 kv (run 7) produced a scratch width of approximately 8 microns, while that formed at 0.5 kv (run 4) had a scratch width of less then 6 microns.

Comparing runs 6 and 7 in FIG. 8a, compositions formed with the inclusion of helium in the plasma gas can be understood. In run 6, an equal ratio of methane and helium was used. In example 7, the ratio of methane to helium was 1 to 10. The harder film, produced by the lower amount of helium, was in run 6. As discussed hereinbefore, it is thought that the helium addition to the formation gas results in bombardment of the forming composition. The bombardment can affect the hardness of the composition by reducing the amount of hydrogen. As the data in FIG. 8a indicates, too much helium results in a softening of the film.

Primary Ion Beam

Figure 9:
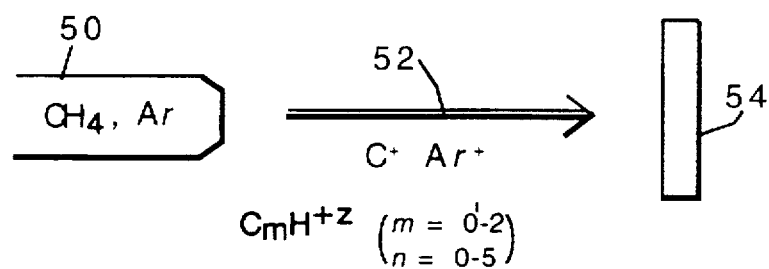
FIG. 9 is an illustration of a primary ion beam apparatus.

Referring now to FIG. 9, in the primary ion beam method, methane and argon, for example, may be introduced into a low energy, high current ion gun 50. The ions 52 that issue from the ion gun 50 are directed at the target to be coated 54. The argon facilitates providing the energy to the particles within the desired range of about 30–200 eV.

Referring now to Table III, films which may be produced by the primary ion bean method by variation of operating parameters and compositions will be discussed. Qualitative reference to a property is relative to example (j).

The ion beam composition may include constituents for forming compositions with varying properties similar to the RF discharge method above. For example, methane may be employed to provide a composition of carbon and hydrogen, while silane may be added to supply silicon example (l) and a fluorocarbon added to supply fluorine example (k). Gas components also may be added into the vacuum chamber and subsequently converted advantageously so as to alter

TABLE III

| Example | Ion Energy Source Potential | Ion Beam Composition | Operating Pressure, Torr | Composition Properties |
|---|---|---|---|---|
| j) | 100v | $Ar/CH_4 = 3$ | less than $10^{-4}$ | High wearability, high lubricity |
| k) | 100v | $Ar/CH_4 = 3$, plus 2% $CHF_3$ | $10^{-4}$ | Higher wearability, higher lubricity |
| l) | 100v | $Ar/CH_4 = 3$, plus 1% Silane | $10^{-4}$ | Higher wearability, superior adhesion |
| m) | 25v | $Ar/CH_4 = 3$ | $10^{-4}$ | Softer film | film properties (e.g. via charge exchange).

Secondary Ion Beam

Figure 10:
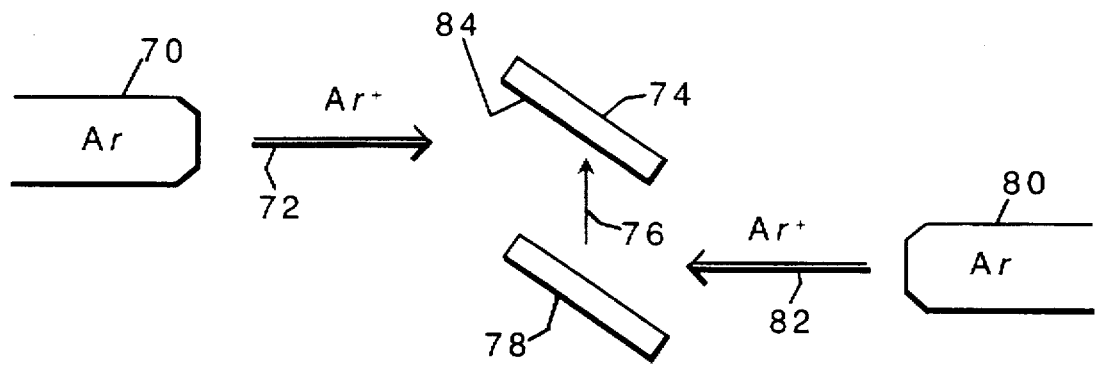
FIG. 10 is an illustration of a secondary ion beam apparatus.

Referring to FIG. 10, the secondary ion beam method involves a primary ion gun 80, operating at, for example, 1–3 kV potential with a current density of 0.5–2 mA/cm$^2$, which directs argon ions 82 toward a carbon target 78. Neutral carbon atoms 76 are consequently ejected from the surface of carbon target and impinge upon the substrate 74. A second ion gun 70, operating at, for example, 25–1000 V and 0.5 mA/cm$^2$ current density, directs a beam of argon ions 72 that impart the required energy to the deposits 84 falling on the surface of the substrate 74 to form the hard carbon compositions, e.g., DLC.

Variation of the properties of the composition in the secondary ion method could be varied by varying the target composition. The energy of the ions at the substrate may also be varied by controlling the second argon beam. The properties of the composition may be changed by the addition of various additives. In this case, constituents of the composition could be added to the ion beam or gas atmosphere of the ion beam chamber or target.

Referring to Table IV, examples of variation of the properties of films which may be produced by the secondary ion beam method will be discussed.

Qualitative reference to a property is relative to table (n).

TABLE IV

| Example | Ion Energy Second Beam | Gas Composition | Gas Pressure | Composition Properties |
|---|---|---|---|---|
| n) | 100v | 100% Ar | $10^{-4}$ torr | Hard film |
| o) | 25v | Ar, $CH_4$ | $10^{-4}$ torr | Softer film, poor wearability |
| p) | 750 v 1000v | Ar, $CH_4$ | $10^{-4}$ torr | Softer film, poor wearability |
| q) | 300v | Ar, F | $10^{-4}$ torr | Hard film, good lubricity |

Referring to Table IV, examples (n) and (q) with a secondary ion energy of 100 and 300 V, respectively, produced films that are generally hard. Examples (o) and (p) resulted in softer films.

The composition of the ion beams or the target or the gas atmosphere in the ion beam chamber may include other constituents for forming compositions with varying properties similar to the RF discharge method by the addition of various additives.

It is also possible to form diamond-like carbon materials and control their properties by following the teachings herein using a conventional DC discharge method appropriately modified.

Use

Figure 11:
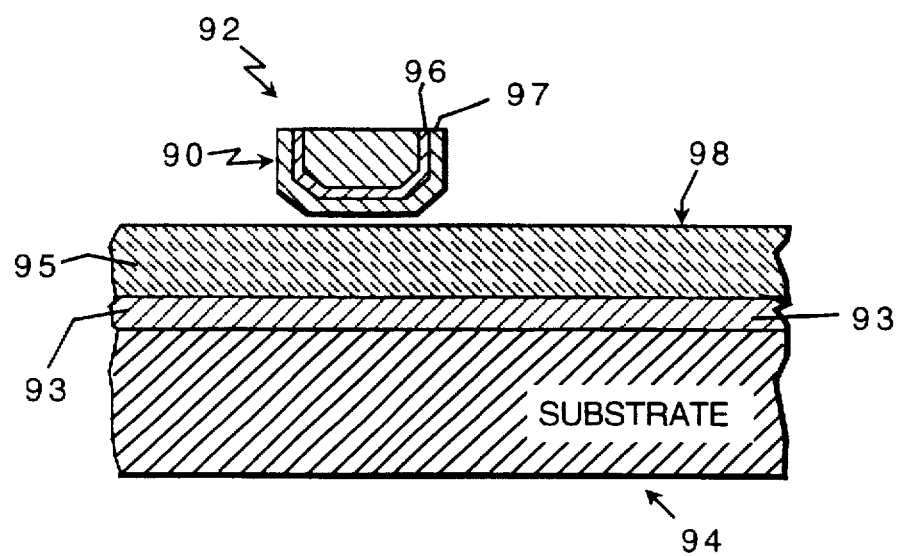
FIG. 11 is a cross-sectional side view of a segment of recording medium 9 and recording head, both coated with compositions according to the invention.

Referring to FIG. 11, a composition formed as described herein, for example, DLC, DHC or HAC layer or film 90 may be used to coat at least the air bearing surface 99 of a read/write head 92 adapted to fly over the surface of a recording disk 94. Film 90 may be applied over an adhesion layer 96, as described above. A film 98 may also protect a magnetic recording substrate shown in FIG. 11, and may be composed of a protective region 95 and stress reduction region 93. In a thermo-magneto-optical storage medium, a spacer layer is applied to an active magnetic layer, the spacer layer then serving as a substrate upon which the film may be formed. The substrate spacer can be a transparent inorganic solid.

The compositions of selected properties may be employed as the coatings for lubrication and corrosion protection, and work well when the slider makes contact with the disk. The surface coating must be a low friction, very thin, coating, preferably 500 Å thickness.

It is also important to protect the surface of the disk recording substrate from electrostatic discharge due to charge induced by the motion of the disk directly under the flying read/write head. The coating may be altered to be at least partially conducting, and thereby be able to remove the induced charge. A coating of much less than a microinch, e.g., 50 Å thickness, would be capable of charge dissipation with high resistence films.

A film of the inventive compositions may also be used to provide a lubricating, corrosion-resistant coating for optical recording media. In these media, a beam of laser light energy must pass through the coating preferably without significant attenuation or scattering, reflect off the recording substrate, and again travel through the coating to be detected by a detector.

Advantageous optical interference and conductive effects can be obtained by proper selection of the optical and conductivity properties of the coating. For example, referring to FIG. 12, a thin but only partially optically absorbing film of chromium 102 may be disposed between the coating 100 of the invention and an optical recording substrate 104. In this embodiment, charge buildup is conducted away from the flying read/write head, while the optical energy of the laser can still reach the recording substrate 104.

Referring to FIG. 13, a layer of amorphous silicon or silicon-nitride 108 is deposited between the HAC, HDC or DLC layer 106 and the recording substrate 110, and is of sufficient thickness to act in concert with layer 106 as a destructive interference package. The interference package filters out wavelengths that interfere with the read/write process. The particular wavelengths filtered may be controlled by the choice of layer thickness of film 106, and may be further tuned by varying the index of refraction of the film 106, for example, between n=1.7 to 2.9, by varying the hydrogen concentration in the film by the methods described (e.g., Table II).

Referring to FIGS. 14 and 14a, a lubricating and protecting layer 112 formed according to the invention may be modified so as to format the disk. This layer is made of material that absorbs some of the light frequencies used in the optical read/write process and is used to demark sectors and quadrants on the optical disk. Formatting the optical disk using concentric circular tracks 114 alternating with concentric circular inter-track areas 116 to separate the tracks 114 serves to reduce track-to-track interference. Thin films made of our hydrogenated carbons may be patterned using conventional bombardment by ion beam techniques to color portions of the disk to format the layer.

Additionally, organic photoresists, polyimides, and hydrogenated carbon, may be added in multiple layers or individually, and the depth of the light absorbing material in the inter-track area may be varied, so as to define packets of tracks for formatted data storage regimes. The packets may be added by conventional spin or dip coating techniques. Referring to FIG. 14a, which is a partial cross section along line 14a—14a of FIG. 14, for example, packet "Z" might be defined as those tracks whose inter-track bands are 100 A thick, and packet "X" might be defined as those tracks whose inter-track bands are 200 A thick. The depth of the inter-track band could be controlled by controlling the energy of the ion beam and ion dose used in fabrication.

Disks and sliders for recording media with coatings formed according to these teachings might also be coated with a liquid lubricant such as a fluorocarbon lubricant to further reduce friction effects. As described herein, the wetability of the composition may also be controlled to facilitate application of such lubricants.

It will be understood by those skilled in the art that many variations of the above teachings may be implemented without departing from the spirit and scope of the present invention. For example, other source gases beside methane might be employed, such as ethane, propane, acetylene, ethylene, benzene, etc., to provide carbon and hydrogen in the RF production mode. The invention therefore, is to be limited only by the claims below.

What is claimed is:

1. A method of controlling wearability of a composition formed by depositing constituents of a formation gas onto a substrate, said constituents including carbon and hydrogen, or ions thereof, and optionally including one or more elements selected from a group consisting of fluorine, boron, oxygen, argon, and helium, or ions thereof, said method comprising the steps of:

including silicon, or ions thereof, in said constituents of said formation gas, selecting in accordance with said wearability:
  a) molar ratios between said carbon, hydrogen, and silicon in said formation gas, wherein said molar ratios of carbon to silicon and hydrogen to silicon are, respectively, 5.6:1 and 0.3:1 or greater, such that decreasing said molar ratios of carbon or hydrogen to silicon increases said wearability, and
  b) an impact energy within a range of 30 eV to 200 eV, inclusive, between ions of said constituents in said formation gas and said substrate, such that increasing said impact energy increases said wearability, placing said substrate in a chamber, introducing into said chamber said formation gas having a pressure between 5 mtorr and 100 mtorr and said selected molar ratios of said carbon to silicon, and said hydrogen to silicon, and energizing said formation gas to cause said ions of said constituents in said formation gas to strike said substrate with said selected impact energy, whereby said constituents are deposited on said substrate to form said composition with said wearability in accordance with said selected molar ratios and said selected impact energy, said composition having a density of between 0.29 moles of atoms per cubic centimeter and at least 0.18 moles of atoms per cubic centimeter, and having the formula:

wherein A is boron or oxygen, and $0<z+w\leq 0.15$, $0<z$, $0\leq w\leq 0.05$, $0\leq x\leq 0.10$, and $0<y<1.5$.

2. The method of claim 1 wherein said energizing includes applying a bias voltage to said substrate to generate said potential difference.

3. The method of claim 1 further comprising forming multiple compositions on said substrate.

4. The method of claim 3 further comprising forming multiple layers of compositions on said substrate.

5. The method of claim 1, wherein said energizing includes controlling said pressure of said formation gas to cause said ions to strike said substrate with said selected impact energy.

6. The method of claim 1, wherein adhesion of said composition to said substrate is controlled along with said wearability, said adhesion being increased by decreasing the molar ratio between said carbon and silicon.

7. The method of claim 1, wherein said constituents include fluorine.

8. The method of claim 7, wherein lubricity of said composition is controlled along with said wearability, said lubricity being increased by increasing an amount of fluorine in said composition.

9. The method of claim 2 wherein said energizing includes applying a bias voltage to said substrate to generate a potential difference between said ions and said substrate, said controlling further comprising adjusting said bias voltage to approximately 500 volts.

10. The method of claim 1, wherein said molar ratio of carbon to silicon is about 100:1, and said molar ratio of hydrogen to silicon is about 400:1.

11. The method of claim 2 wherein said controlling includes adjusting said pressure of said formation gas to between 25 and 50 mtorr, inclusive.

12. The method of claim 1 wherein said energizing further includes exposing said substrate to an ion source comprising ions of said constituents.

13. The method of claim 1 wherein said energizing includes generating a potential difference of between 0 and 1500 volts between said ions and said substrate.

14. The method of claim 5 wherein controlling said wearability includes adjusting said level of energizing for a constant pressure of said formation gas, or adjusting said formation gas pressure for a constant energizing level.

15. A method of controlling wearability of a composition formed by depositing constituents onto a substrate, said constituents including carbon and hydrogen, or ions thereof, and optionally including one or more elements selected from a group consisting of fluorine, boron, oxygen, argon, and helium, or ions thereof, said method comprising the steps of:

including silicon, or ions thereof, in said constituents, selecting in accordance with said wearability:
  a) molar ratios between said carbon, hydrogen, and silicon, wherein said ratios of carbon to silicon and hydrogen to silicon are, respectively, 5.6:1 and 0.3:1 or greater, such that decreasing said molar ratios of carbon or hydrogen to silicon increases said wearability, and
  b) an impact energy within a range of 30 eV to 200 eV, inclusive, between ions of said constituents and said substrate, such that increasing said impact energy increases said wearability, placing said substrate in a chamber, placing a target compound comprising said constituents in said selected ratio in the chamber, impacting said target compound with an ion beam to cause said ions of said constituents to be released from said target compound at a pressure of between 5 mtorr and 100 mtorr, said ions of said constituents being released in said selected molar ratios of said carbon to silicon, and said hydrogen to silicon, to strike said substrate, and energizing said ions of said selected set of constituents so that said ions have said selected impact energy, whereby said constituents are deposited on said substrate to form said composition with said wearability in accordance with said selected molar ratios and said selected impact energy, said composition having a density of between 0.29 moles of atoms per cubic centimeter and at least 0.18 moles of atoms per cubic centimeter, and having the formula:

wherein A is boron or oxygen, and $0<z+w\leq 0.15$, $0<z$, $0\leq w\leq 0.05$, $0\leq x\leq 0.10$, and $0<y<1.5$.

16. The method of claim 15, wherein adhesion of said composition to said substrate is controlled along with said wearability, said adhesion being increased by decreasing the molar ratio between said carbon and silicon.

17. The method of claim 15, wherein said constituents include fluorine.

18. The method of claim 17, wherein lubricity of said composition is controlled along with said wearability, said lubricity being increased by increasing an amount of fluorine in said composition.

19. The method of claim 15, wherein said molar ratio of carbon to silicon is about 100:1, and said molar ratio of hydrogen to silicon is about 400:1.

* * * * *